(12) United States Patent
Selz et al.

(10) Patent No.: US 6,870,206 B2
(45) Date of Patent: Mar. 22, 2005

(54) SEMICONDUCTOR CHIP, FABRICATION METHOD, AND DEVICE FOR FABRICATING A SEMICONDUCTOR CHIP

(75) Inventors: Manfred Selz, Neubiberg (DE); Michael Wagner, Oberschweinbach (DE)

(73) Assignee: Infineon Technologies AG, Munich (DE)

( * ) Notice: Subject to any disclaimer, the term of this patent is extended or adjusted under 35 U.S.C. 154(b) by 82 days.

(21) Appl. No.: 10/306,438

(22) Filed: Nov. 27, 2002

(65) Prior Publication Data

US 2003/0122161 A1 Jul. 3, 2003

(30) Foreign Application Priority Data

Nov. 27, 2001 (DE) .......................................... 101 59 216
Feb. 28, 2002 (DE) .......................................... 102 09 073

(51) Int. Cl.$^7$ ............................................. H01L 27/10
(52) U.S. Cl. ....................................... 257/208; 257/210
(58) Field of Search .......................................... 257/208

(56) References Cited

U.S. PATENT DOCUMENTS 4,870,300 A * 9/1989 Nakaya et al. ................ 326/41
5,468,977 A 11/1995 Machida
5,635,737 A * 6/1997 Yin ............................. 257/204

FOREIGN PATENT DOCUMENTS

| DE | 42 39 463 C2 | 5/1993 |
| JP | 60 123 144 A | 8/1985 |
| JP | 60 153 144 A | 8/1985 |
| JP | 62 152 141 A | 7/1987 |
| JP | 02 201 958 A | 8/1990 |
| JP | 02 224 370 A | 9/1990 |
| JP | 04 075 370 A | 3/1992 |
| JP | 05 055 379 A | 3/1993 |
| JP | 05 343 653 A | 12/1993 |
| JP | 07 321 295 A | 12/1995 |
| JP | 410261780 * | 9/1998 |

* cited by examiner

*Primary Examiner*—Douglas Wille
(74) *Attorney, Agent, or Firm*—Laurence A. Greenberg; Werner H. Stemer; Gregory L. Mayback

(57) ABSTRACT

A semiconductor chip has standard cells arranged in a plurality of mutually adjacent rows. Each standard cell is connected by a plurality of tracks for connection to other elements of the semiconductor chip and/or terminals of the semiconductor chip. The power supply tracks of the standard cells of at least one row of standard cells are shortened in such a way that the tracks terminate in the region of a standard cell at the edge of the row.

22 Claims, 14 Drawing Sheets

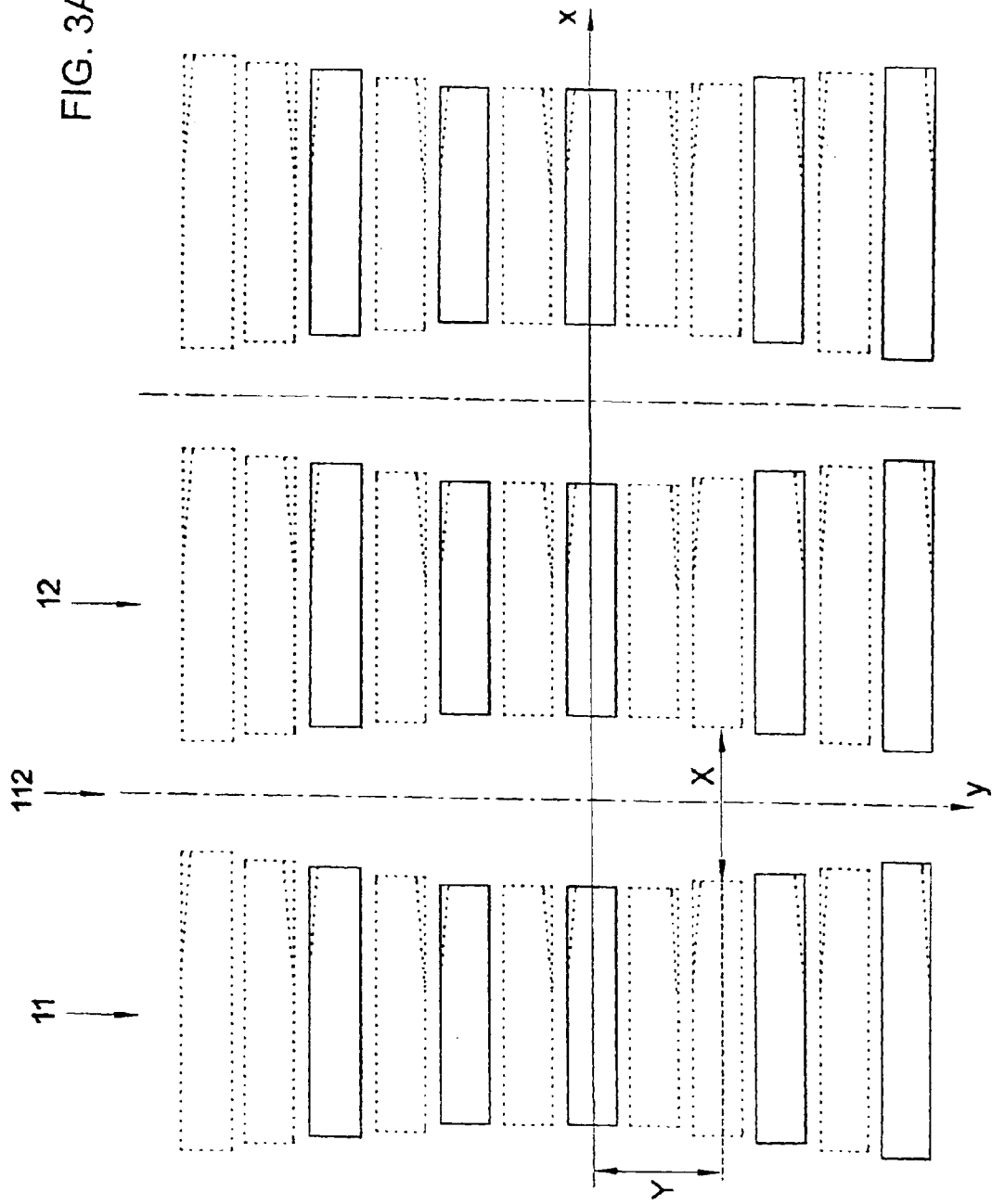

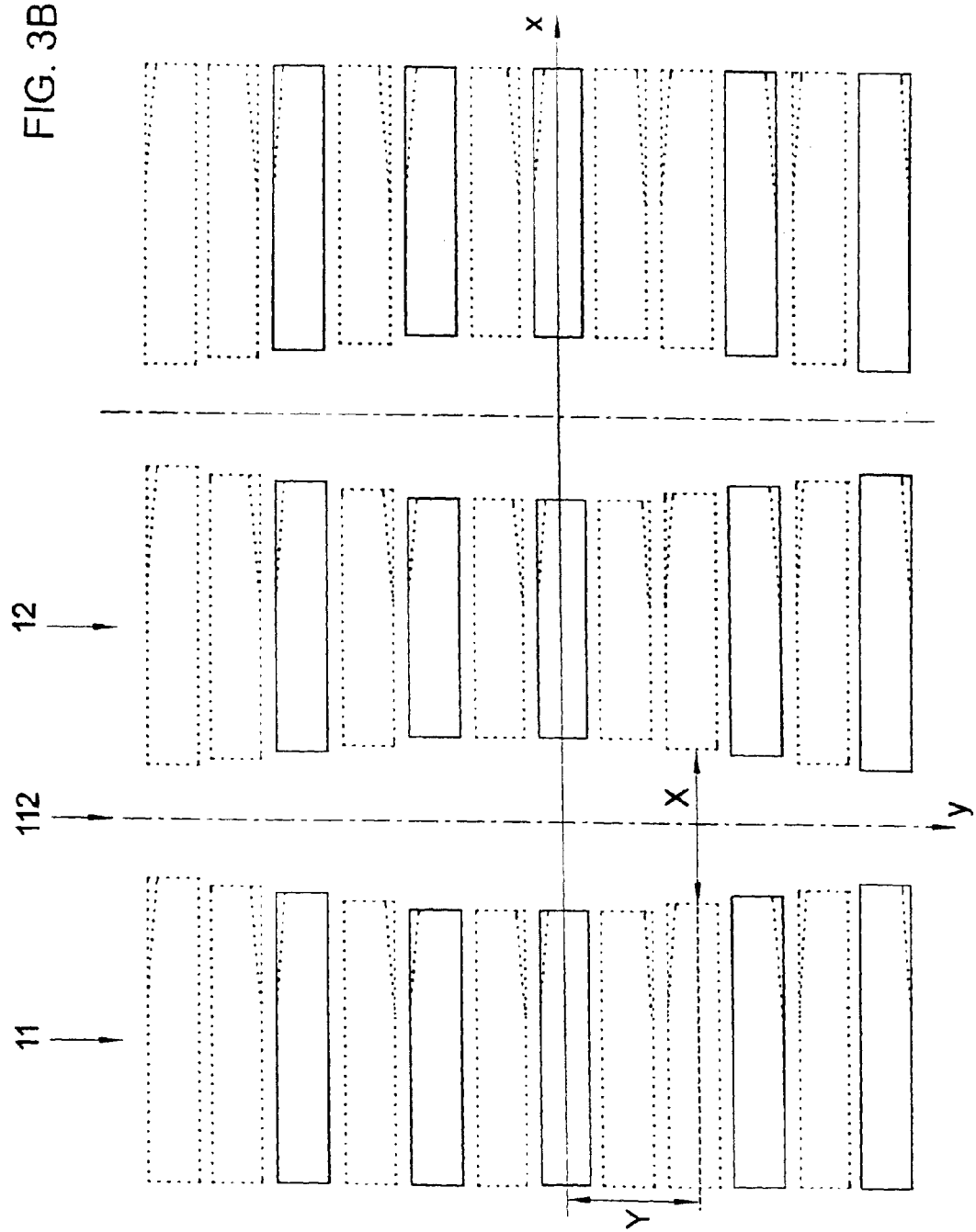

SEMICONDUCTOR CHIP, FABRICATION METHOD, AND DEVICE FOR FABRICATING A SEMICONDUCTOR CHIP

BACKGROUND OF THE INVENTION

Field of the Invention

The invention lies in the field of semiconductor technology. More specifically, the invention relates to a semiconductor chip, and to a method and a device for carrying out the method for fabricating the semiconductor chip using standard cells.

Standard cells are used to speed up the design of a semiconductor chip. Examples of the standard cells are gates, shift registers or other digital or analog modules which are formed from individual integrated components such as transistors, diodes or resistors and generally provide one or more standardized functions.

Standard cells are disclosed in U.S. Pat. No. 5,468,977 for example. These standard cells are arranged by way of a CAD system and subsequently wired by way of tracks. The tracks of a semiconductor chip designed in this way are insulated by an insulation layer perforated with contact holes for the connection of the tracks.

The standard cells are usually arranged along a plurality of mutually adjacent rows. The standard cells of a row are supplied with current by means of tracks that are arranged along the row. Depending on the number of voltages or currents required within the row, two or further tracks for power supply extend along the rows. The associated power supply tracks of each row are connected to one another and further elements or terminals of the semiconductor chip.

Moreover, provision is usually made of further tracks in particular for the transmission of analog or digital signals between the standard cells or to terminals of the semiconductor chip. The tracks are arranged in one or generally in a plurality of so-called metallization planes. These wiring planes can also be utilized for the arrangement of optical tracks, in particular optical conductors, in addition to metallic connections.

In order to arrange the tracks optimally, a so-called router program is used, which connects the inputs and outputs of the standard cells among one another and to terminals of the semiconductor chip. Afterward, the respective position or the course of the individual tracks is disentangled in order to enable the densest possible arrangement of the standard cells or of the tracks and the shortest possible signal delay. It goes without saying that, in addition to this known arrangement of standard cells and the wiring thereof, further arrangement specifications are conceivable, for example a vertical or function-related arrangement, for example for isolating a digital and an analog region of an ASIC or the like.

On account of the size and the geometry of the standard cell and the prescribed arrangement thereof within a plurality of rows, the space for the arrangement of the tracks is severely limited if an unnecessarily high number of metallization planes is to be prevented.

SUMMARY OF THE INVENTION

It is accordingly an object of the invention to provide a semiconductor chip, which overcomes the above-mentioned disadvantages of the heretofore-known devices and methods of this general type and which allows the tracks to be densely packed without increasing the number of wiring planes. It is also an object of the invention to provide an advantageous fabrication method and a device for producing the novel semiconductor chip.

With the foregoing and other objects in view there is provided, in accordance with the invention, a semiconductor chip, comprising:

a multiplicity of standard cells arranged in a plurality of mutually adjacent rows;

tracks disposed to connect the standard cells to at least one of other elements of the semiconductor chip and terminals of the semiconductor chip, the tracks including power supply tracks for a power supply to the standard cells;

signal track regions defined for arranging signal tracks between the rows;

the signal track regions adjoining the power supply tracks for the power supply of the standard cells; and a respective the power supply track for supplying power to at least one row of the standard cells is a shortened track such that an adjoining the signal track region is enlarged due to a shortening of the power supply track.

In accordance with an added feature of the invention, the signal track regions are formed as wiring channels, and a width of at least one wiring channel, at a given location along the wiring channel, is determined by a prescribed unambiguous and variable assignment specification.

In other words, the invention provides a semiconductor chip having standard cells arranged in a plurality of mutually adjacent rows. Tracks are thereby arranged for the connection of the standard cells to other elements of the semiconductor chip and/or terminals of the semiconductor chip. Regions for the arrangement of signal tracks are provided between the rows of standard cells. The regions for the arrangement of the signal tracks are arranged in such a way that they adjoin tracks for the power supply of the standard cells.

The tracks for the power supply of at least one row of standard cells are shortened in such a way that the adjoining region for the arrangement of signal tracks is enlarged by the shortening of the tracks for power supply. This shortening produces space for additional elements of the integrated semiconductor chip. In particular, this space is utilized for further wirings of standard cells, in particular signal lines; as an alternative, capacitances or inductances or optical signal lines can also be integrated in said resulting space.

The power supply tracks are preferably shortened in such a way that, with inclusion of process fluctuations, the standard cells at the edge of the row are reliably supplied with current by provision of an overlap region between the power supply terminals of the standard cell and the tracks for power supply. For this purpose, in an advantageous development of the invention, the tracks end at the edge of the row in the region of a standard cell, preferably within the standard cell itself.

In order to simplify this calculation and to ensure a power supply under relatively poor conditions, in an alternative refinement of the invention, the shortened tracks for power supply project beyond the edge of the outer standard cell of a row by a tolerance compensation region of a few $\mu$m.

In an advantageous development of the invention, said ends of the tracks for power supply are adjoined by a region for the arrangement of the signal tracks which is occupied by laid signal tracks. In this region, according to the invention, said signal tracks are also arranged in the wiring plane of the power supply tracks, thereby also enabling wirings by means of the signal tracks transversely with respect to the direction of the rows in these regions. The signal tracks serve for the transmission of signals between the standard cells or the terminals of the semiconductor chip.

If the design of the semiconductor chip is configured flexibly such that the density of the arrangement of the standard cells is not critical, such as, for example, in the integration of analog circuits that are particularly immune to interference, in an alternative refinement of the invention, the standard cells within one row are positioned with respect to one or more corresponding standard cells of another row in order to shorten the tracks for the transmission of time-critical signals between said standard cells.

If, by contrast, a particularly dense arrangement of the standard cells is desirable, or only a small number of wiring planes, for example 2, are available, in an advantageous development of the invention, the standard cells within a row are arranged adjacent to one another in such a way that interspaces between the standard cells are reduced.

In prior art methods, it is not possible to adapt the width of the region for arrangement of the signal tracks, which are advantageously formed as elongated wiring channels, to the respective conditions, which is disadvantageous particularly in the case of accumulations of wiring crossings.

Accordingly, it is a continuing object of the invention to enable the width of these wiring channels to be altered in a flexible manner. For this purpose, the invention has a semiconductor chip, the width of at least one wiring channel for standard cells on a semiconductor chip being determined at at least one location by means of a prescribed unambiguous and variable assignment specification. A variable assignment specification is understood here to mean that the width can be altered by the assignment specification in a manner deviating from a constant width. It is thus possible to produce a circuit in a particularly space-saving manner.

It is advantageous if the unambiguous, variable assignment specification is designed as a functional relationship, as a table with predetermined values and/or as a correlation. It is thus possible to react flexibly in accordance with the design prescriptions that are present in each case. When using a table, values for the width that are determined by design prescriptions or simulations, for example, can be used without a functional relationship having to be known. Geometries that are particularly simple to realize result if the assignment specification has at least one linear function, at least one polygon progression and/or a polynomial.

For simple production, it is advantageous if, in the case of at least one wiring channel, at least one width determined by the unambiguous assignment specification is arranged symmetrically with respect to the longitudinal axis of the wiring channel. It is also advantageous if the width of at least one wiring channel is determined in a manner dependent on the vertical position of the location.

Furthermore, it is advantageous for simple fabrication if the contour—formed by the widths—of at least one wiring channel is arranged symmetrically with respect to a horizontal axis.

It is particularly advantageous if the width of at least one wiring channel is determined by an assignment specification in a manner dependent on the crossing density of wirings in the wiring channel. As a result, the wiring channel can be made widest at the point where there is the greatest need for space. In this case, it is advantageous if, in at least one wiring channel, the maximum width is arranged in the region of the maximum crossing density.

With the above and other objects in view there is also provided, in accordance with the invention, a method of fabricating a semiconductor chip, which comprises:

forming standard cells within a plurality of mutually adjacent rows;

connecting each of the standard cells with a plurality of tracks for connection to other structures selected from the group consisting of another element of the semiconductor chip and a terminal of the semiconductor chip;

determining a power supply region of at least one outer standard cell of the standard cells of the respective row; and determining a configuration of tracks for power supply up to the power supply region of the standard cell.

There is also provided, in accordance with the invention, a method of fabricating a semiconductor chip, which comprises:

evaluating a prescribed variable assignment specification for a width of at least one wiring channel at a location along the wiring channel; and subsequently laterally forming at least one structure selected from the group consisting of a standard cell and a row of the standard cells such that the at least one wiring channel has the width at the location in accordance with the assignment specification.

In a method for fabricating a semiconductor chip described above, standard cells are arranged in a plurality of mutually adjacent rows, and each standard cell is connected by a plurality of tracks for connection to other elements of the semiconductor chip and/or terminals of the semiconductor chip. Tracks for power supply are preferably arranged along the row of standard cells and in each case supply the standard cells of a row with current or different supply voltages.

A power supply region of at least one of the outer standard cells of the row is determined by determining, in particular, the position of the power supply terminals, that is to say the connecting points to the individual elements of the standard cell, such as transistors, diodes or the like. An arrangement of the tracks for power supply up to said power supply region of the standard cell is subsequently determined, so that the power supply terminals are positioned with respect to the tracks for power supply and ensure a reliable power supply. For this purpose, in a refinement of the invention, the power supply region ends within the outer standard cell of the row.

In order to simplify the method in terms of computation technology, in an advantageous development of the method, the outer edge of the standard cell is determined and the entire region of the standard cell is defined as the power supply region, so that the power supply region ends at the outer edge of the outer standard cell of the row. The edge region of the standard cell can be determined particularly simply for this purpose.

An advantageous refinement of the invention provides for a region for power supply up to the outer standard cell of the row to be determined by each standard cell of the present row being compared with an outer maximum position. The start value of the maximum position is prescribed at the beginning preferably in the central region of the row. For the comparison, the coordinates of the present standard cell in the direction of the row length are compared with the coordinate of the maximum position in the same direction.

In the event of the outer maximum position being exceeded by the power supply region of the present standard cell, in particular if the coordinates of said standard cells exceed the coordinates of the maximum position, the maximum position is redefined to the power supply region of said standard cell. For the definition, by way of example, the coordinate of the maximum position is set such that it is equal to the outer coordinate of said standard cell.

After the last comparison of the present row, the region for power supply of said present row is set up to the last maximum value, so that the power supply tracks reach as far as this coordinate of the last maximum value.

If the power supply region of the outer standard cell of the row has been determined, it is preferably stored or made available in some other way for further evaluation. The region adjoining the power supply region can subsequently be determined and be used as a spacer for a subsequent wiring (routing), in particular the wiring in the regions for the arrangement of the signal tracks. In an advantageous refinement of the method, in this region, in the wiring plane of the tracks for power supply, the arrangement of signal tracks for the transmission of signals to other elements of the semiconductor chip and/or terminals of the semiconductor chip is determined.

According to the invention, a prescribed and variable assignment specification is evaluated for the width of at least one wiring channel at at least one location along the wiring channel. Afterward, at least one standard cell and/or at least one row is arranged laterally in such a way that the at least one wiring channel has, at the location, in each case the width in accordance with the assignment specification.

By way of example, a suitable software or a hardware that is specialized for an arrangement of the wiring is used as means for carrying out this method. The software and the hardware can also be integrated into an overall system that enables the fabrication of intermediate products, for example of exposure masks with the structures according to the invention. There is thus also provided, in accordance with the invention, a computer program product, a computer-readable medium with computer-executable instructions, and a corresponding computing device broadly containing the invention.

Other features which are considered as characteristic for the invention are set forth in the appended claims.

Although the invention is illustrated and described herein as embodied in a semiconductor chip, and method and device for fabricating the semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a diagrammatic illustration of three columns of standard cells with two wiring channels, the columns each having concave contours;

FIG. 3B is a diagrammatic illustration of three columns of standard cells with two wiring channels, the columns being straight at the outer sides.

DESCRIPTION OF THE PREFERRED EMBODIMENTS

Figure 1:
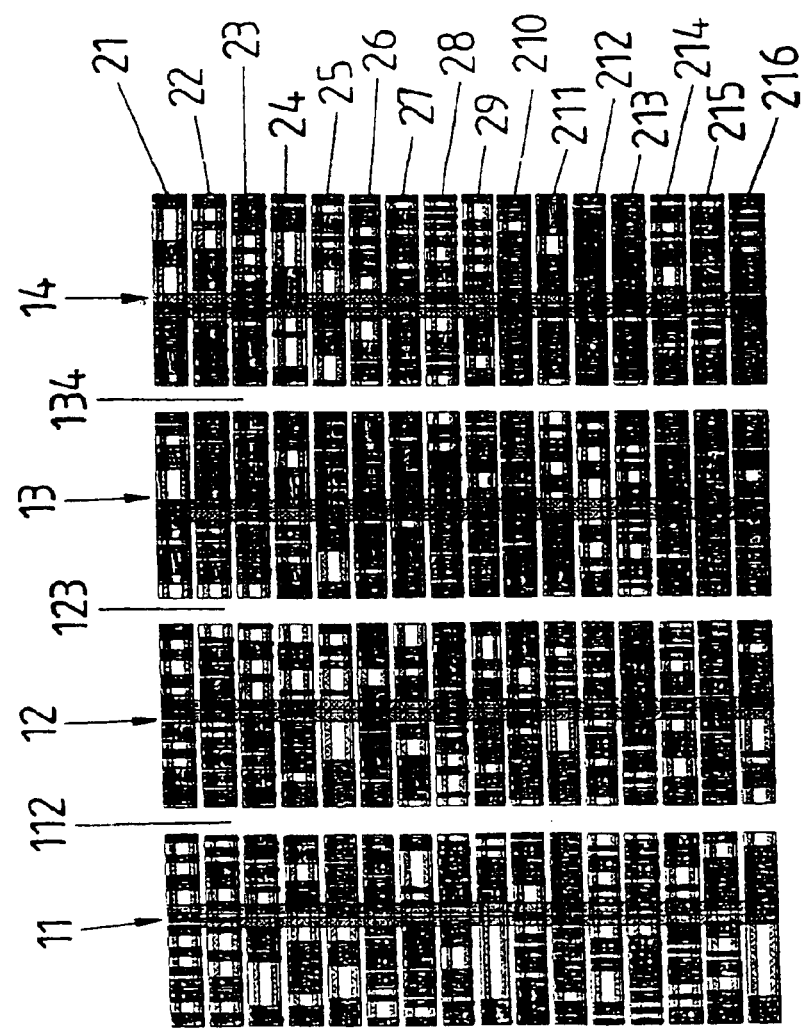
FIG. 1 is a plan view showing an illustration of a semiconductor chip with standard cells arranged in rows in accordance with the prior art.
Figure 1A:
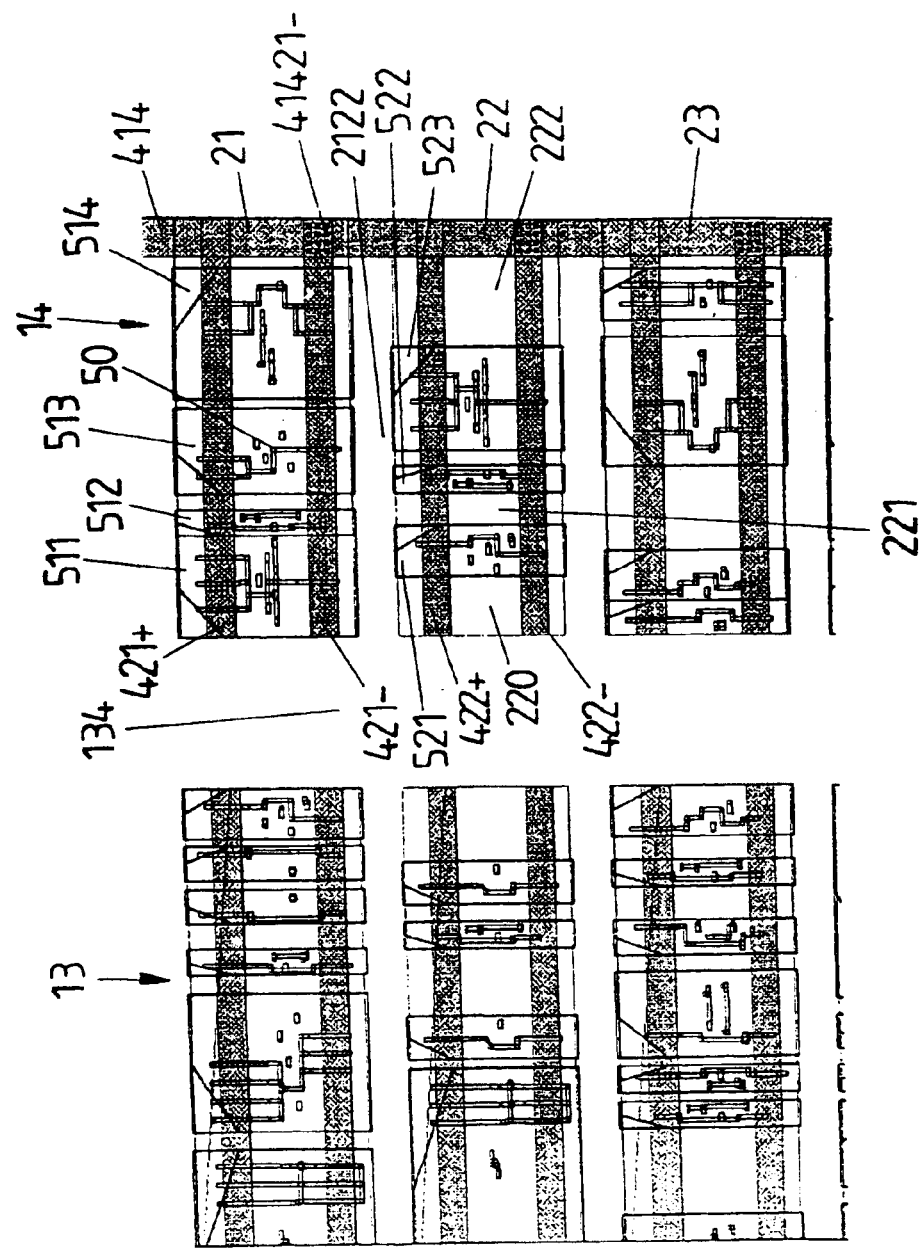
FIG. 1A is a partial detail illustration from the prior art chip of FIG. 1.

Referring now to the figures of the drawing in detail and first, particularly, to FIGS. 1 and 1A thereof, there are shown standard cells in a structure of a semiconductor chip in accordance with the prior art.

Four columns 11, 12, 13, 14 having a plurality of rows 21 to 215 with standard cells 511, 512, 513, 514, etc. are provided in this example. The standard cells 511, etc. are for example gates, shift registers or other digital or analog modules which are predefined as standard. This predefinition specifies how individual integrated components such as transistors, diodes or resistors are interconnected.

By virtue of this cell structure, the outer dimensions of the respective standard cell are in this case fixedly prescribed, but, for different standard cells 511, 512, etc., can significantly deviate from one another in terms of width. This is shown by the illustration of the standard cells 511 and 512 in FIG. 1A. The standard cells 511, etc. generally provide one or more standardized functions. In this example, the height of the standard cells 511, etc. is likewise fixedly prescribed, so that the height does not vary within a row 21, etc.

The standard cells 511 to 514 and 521 to 523 of a row 21 and 22, respectively, are connected by means of power supply tracks 421+, 421−, 422+ and 422−, etc. to terminals or functional units of the semiconductor chip for supplying the respective standard cell 511, etc. with the necessary energy. For this purpose, the power supply tracks 421+, 421−, 422+ and 422−, etc. of all the rows 21 and 22, etc. of a column 11, 12, 13, 14 are connected to column supply tracks 414 via contact regions 41421−(pin through), which are preferably arranged in the center of the rows 21, etc. over the entire height of the respective column 14, etc.

For signal transmissions or for the connection of potentials, tracks 50 are provided within a standard cell 513, etc., which tracks connect individual components such as the gate of a transistor and a diode, etc. of a standard cell 513 to one another. Furthermore, the standard cells 513, etc. are connected among one another or to terminals of the semiconductor chip. For these connections, signal tracks are used which, like the rest of the tracks, are formed by metal tracks within one or more metallization planes.

Regions for the arrangement of said signal tracks must be suitable for the arrangement thereof. Suitability presupposes that this region is not penetrated by power supply tracks 421+, 421−, 422+ and 422− or terminal arrays. This region should enable the arrangement of at least one, but preferably a plurality of signal tracks between different standard cells to terminals of the semiconductor chip or the like.

Between the rows 21, etc. oriented horizontally in line form, provision is made of spacer regions 2122 between the standard cells 51, etc. of two rows 21, 22, which form such a region 2122 for the arrangement of said signal tracks and can therefore be utilized for a horizontal wiring.

Between the individual columns 11 to 14, provision is made of vertical regions 112, 123, 134 for the arrangement of signal tracks within which no standard cells are arranged. If the regions 112, 123, 134 are designed in elongate fashion as wiring channels 112, 123, 134, as illustrated in FIGS. 1 and 1a, they can advantageously serve for the extensive wiring of remotely arranged standard cells or terminals of the semiconductor chip.

The wiring channels 112, 123, 134 are preferably utilized for a vertical wiring in order to connect standard cells 511, etc. of different rows and/or columns to one another, in order to transmit signals or potentials or, for example, to connect control terminals between these standard cells to one another.

Neither the horizontal nor the vertical regions 2122, 112, 123, 134 for the arrangement of signal tracks are crossed by tracks 421+, 421−, 422+ and 422− for power supply. Such an interruption of said regions 2122, 112, 123, 134 by power supply tracks 421+, 421−, 422+ and 422− significantly restricts the wiring possibilities within a router program. Consequently, said regions 2122, 112, 123, 134 are free of power supply tracks 421+, 421−, 422+ and 422− within this wiring plane.

Figure 2:
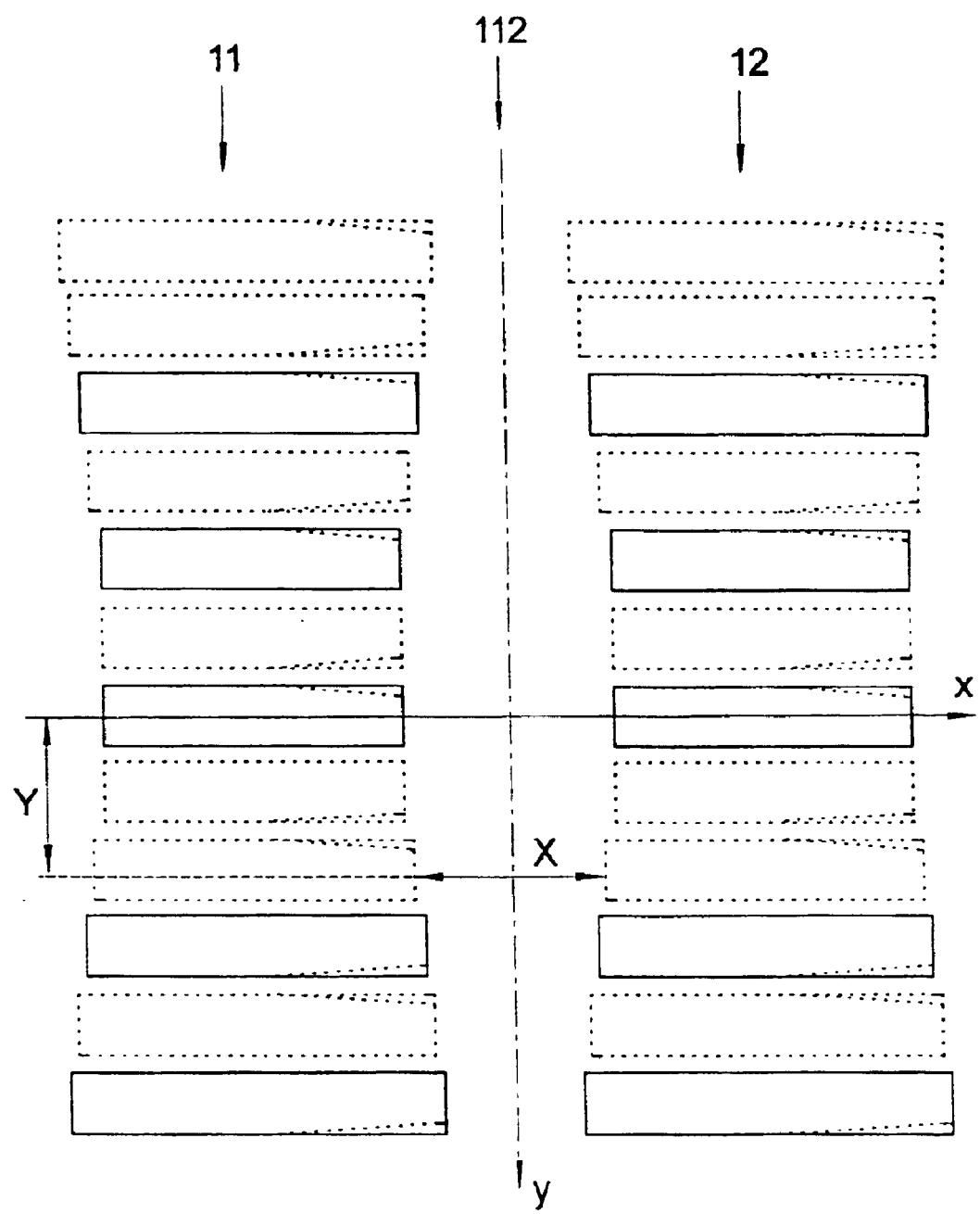
FIG. 2 is a diagrammatic plan view illustration of a wiring channel between two rows of standard cells.

FIG. 2 uses a detail to diagrammatically illustrate the configuration of a wiring channel 112 according to the invention. Analogously to FIG. 1, the wiring channel 112 is arranged between two columns 11, 12. For the definition of the geometry, two Cartesian axes are depicted in FIG. 2. A vertical y-axis extends in the longitudinal direction of the wiring channel 112 and a horizontal x-axis extends perpendicularly thereto. A width X of the wiring channel 112 is accordingly determined in the horizontal extent. The position of the location Y at which a specific width X is arranged can be defined using the y-axis.

According to the invention, at at least one location Y along at least one wiring channel 112, the width X of the wiring channel is determined by a prescribed unambiguous assignment specification.

An assignment specification is in this case understood to be any type of unambiguous dimensioning principle for determining at least one width X of the wiring channel 112. Simple assignment specifications are e.g. linear or progressively linear (polygon progression). It is also possible to store numerical values for the determination of the width X in a table or in vector form. Nonlinear assignment specifications can relate e.g. to polynomials which would result in curved lateral contours of the wiring channel 112. The width X can also be determined by combinations of these assignment specifications.

It will be understood that the width X is determined in each case in discrete regions, namely, in the regions of the rows of the standard cells. Thus, if e.g. a continuous polynomial is used as assignment specification, then the polynomial is evaluated only at a few discrete points each having the commensurate distance determined by the rows.

If the assignment specification depends on the x and/or y coordinates, then the following would hold true for the assignment specification F $X:=F(x,y)$ In FIG. 2, the width X first increases in the positive y direction, reaches a maximum in the center between the rows and then decreases. The function of the width X depending on the vertical position would in this case correspond to a downwardly open parabola.

The width X is in this case set such that the rows and/or the individual standard cells are automatically deleted, displaced and/or interrupted in such a way as to produce the predetermined width X.

It is an object of this configuration to produce here in the central region a wiring channel 112 that is as wide as possible. The wirings between the rows, which are not illustrated here for reasons of clarity, naturally cross in the center, so that the largest clearance in the wiring channel 112 is required here. This can also be achieved automatically by the crossing density along the wiring channel 112 being calculated by the routing program. This information can then be used directly as an assignment specification by determining the width X proportionally to the crossing density. The calculated values can then be stored in a vector.

The form of the wiring channel 112 as illustrated in FIG. 2 is axially symmetrical relative to the x and y axes. This need not necessarily be the case.

FIGS. 2A to 2D diagrammatically illustrate other geometries in which the width X is determined in a different way. Thus, the width of the wiring channel 112 can be adapted e.g. to the respective crossing density of the wirings.

Figure 2A:
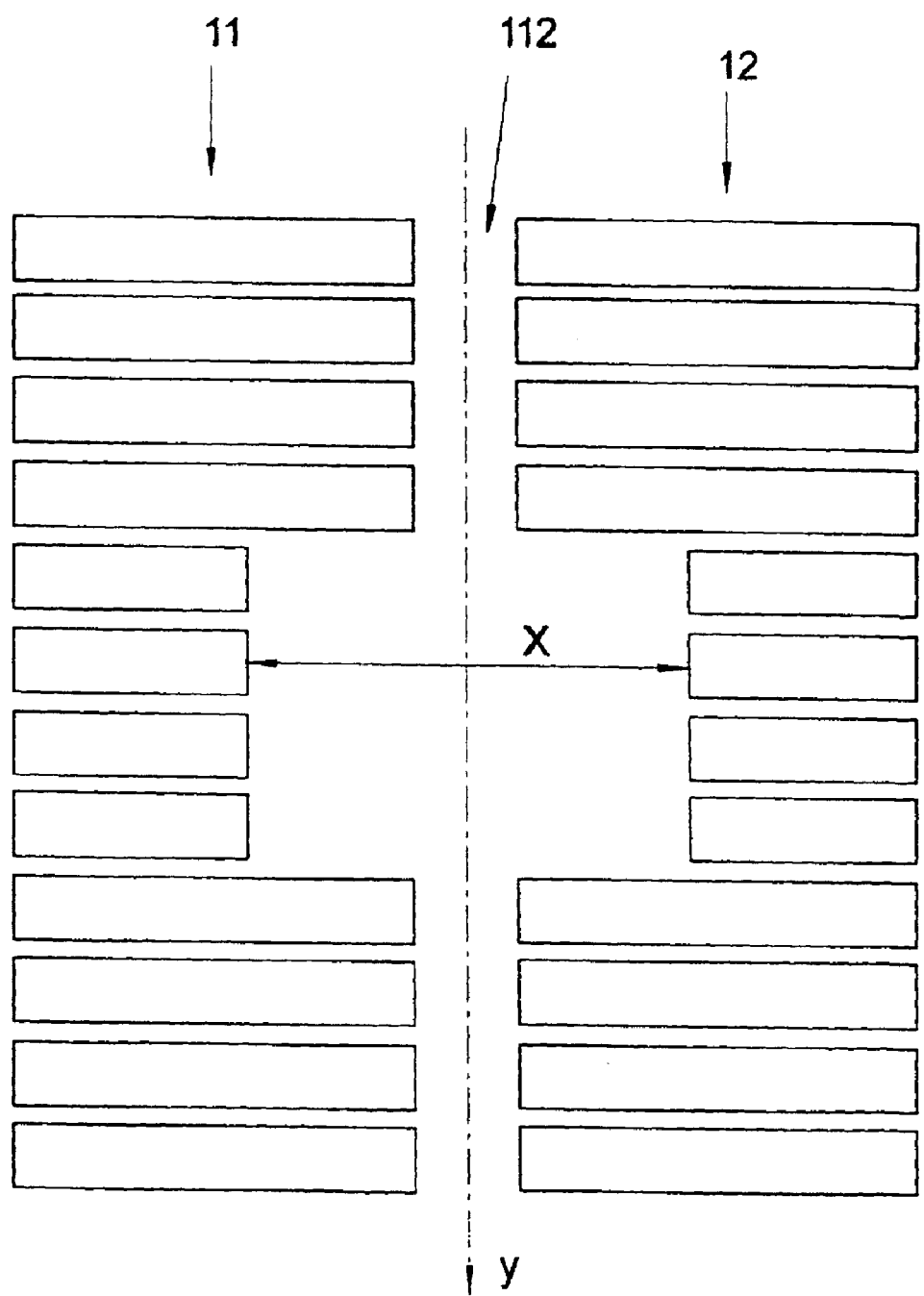
FIGS. 2A–2D show four configurations with different contours of the wiring channel.

In FIG. 2A, the wiring channel 112 is widened abruptly at one location and tapered again. A rectangular widened portion is produced. In this case, the assignment specification would comprise a vector having two different values for determining the width X; for instance:

$F=(0, 0, 1, 1, 1, 1, 0, 0, 0)$.

Figure 2B:
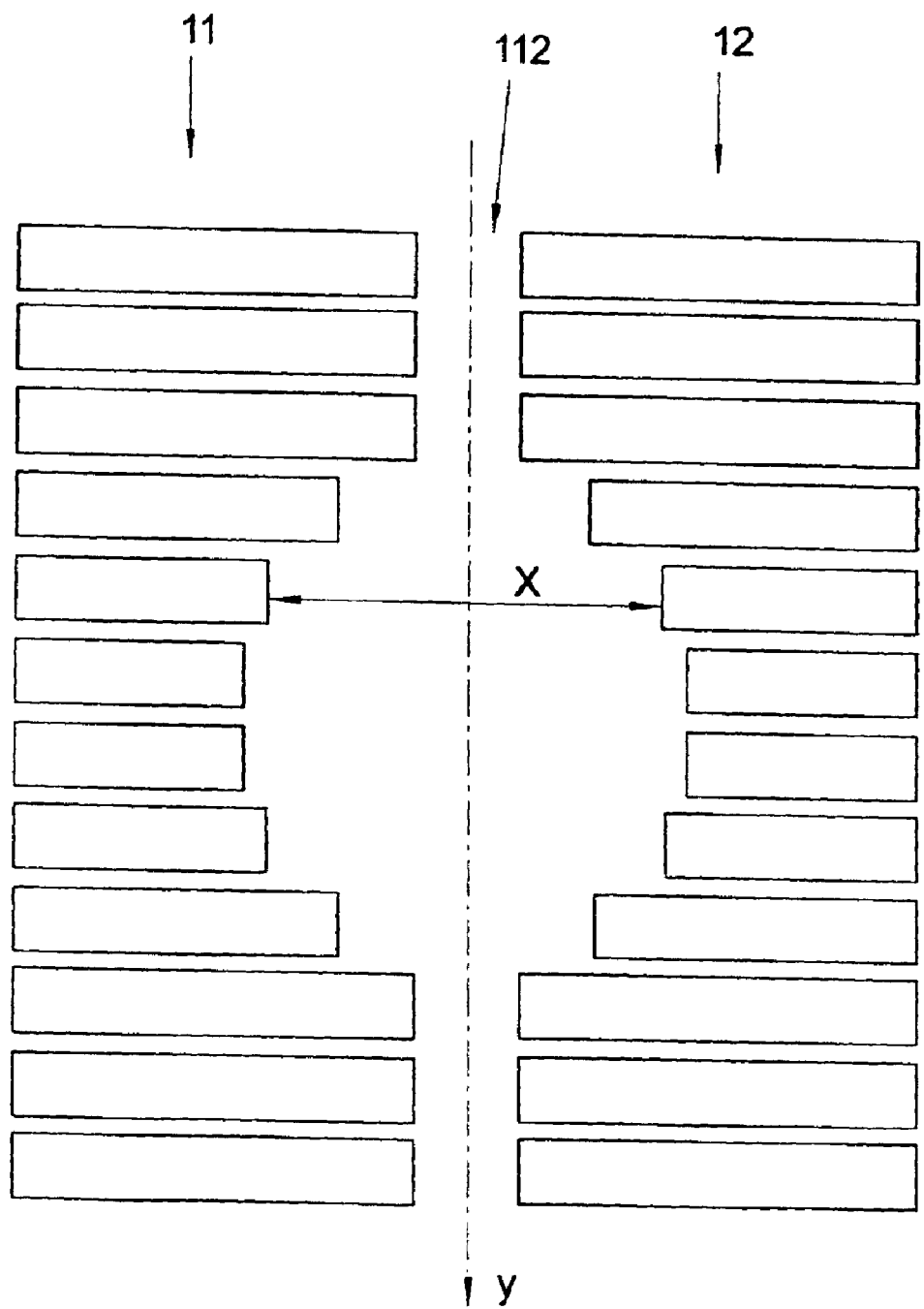

In a modification of the example in FIG. 2A, reference is had to FIG. 2B, which illustrates a rounded widening and tapering.

Figure 2C:
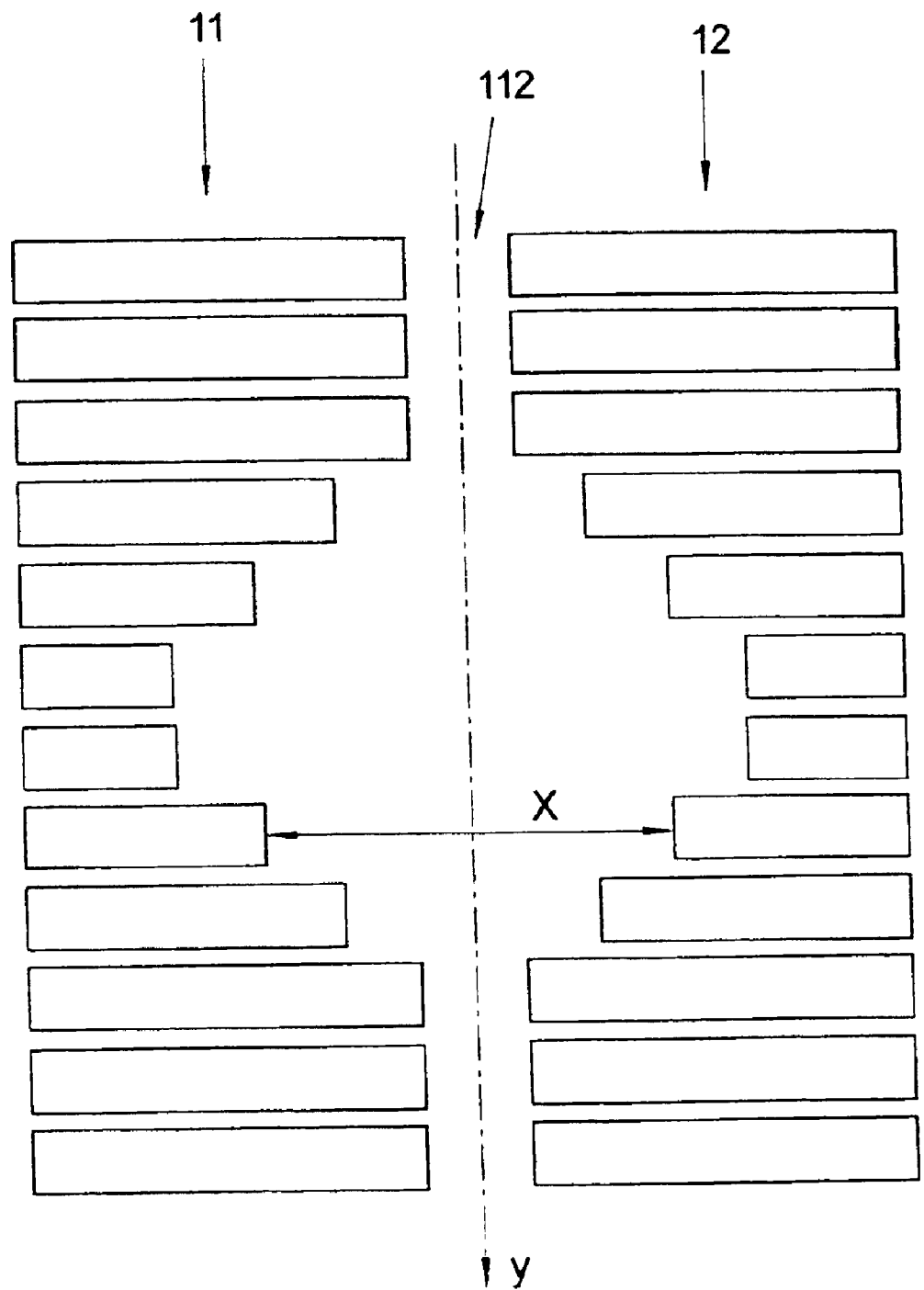

An assignment specification composed of linear sections has been realized in FIG. 2C, resulting in a rhomboidal widened portion.

Figure 2D:
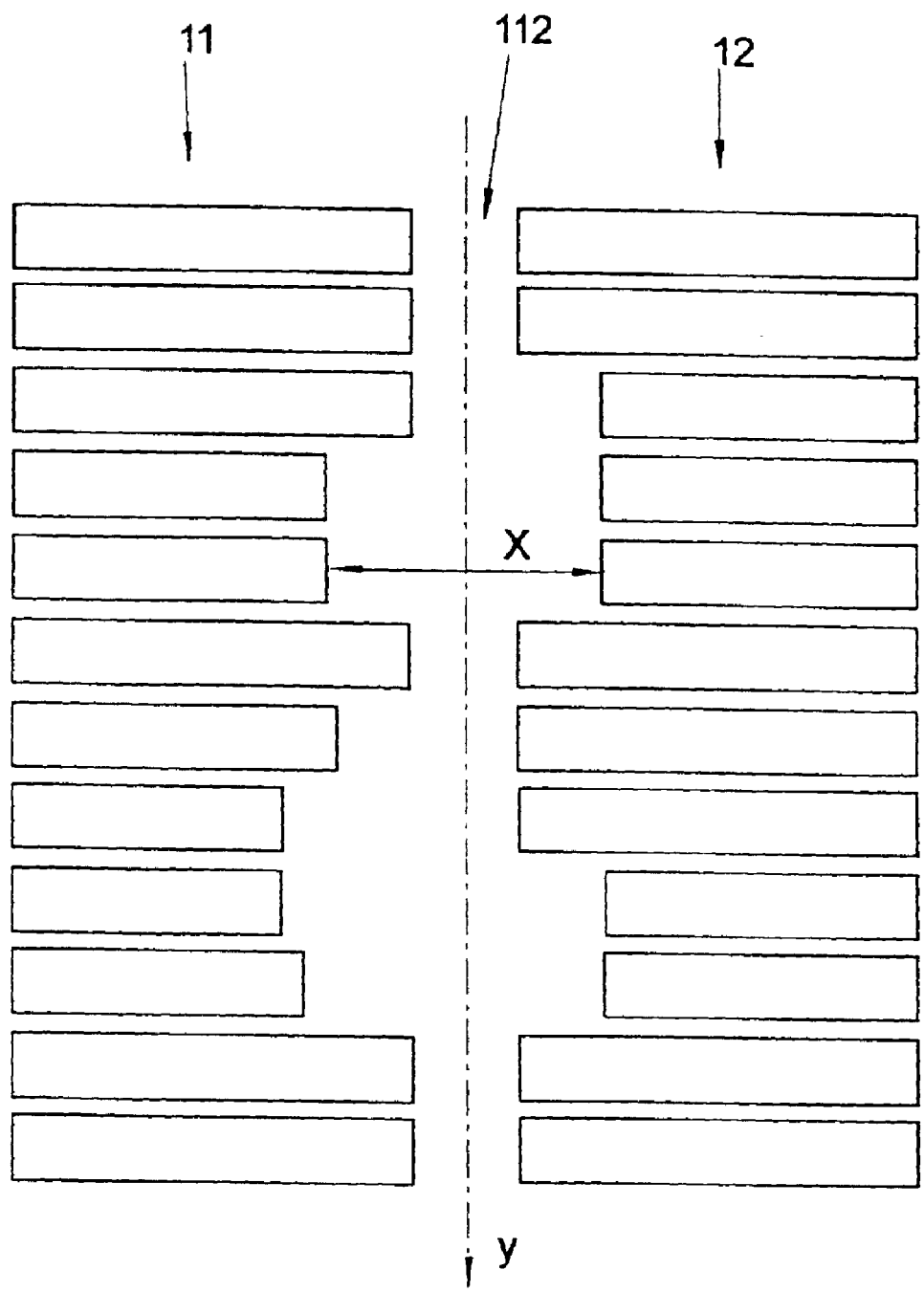

FIG. 2D illustrates that the widened portions need not be arranged only at one location and also need not be symmetrical with respect to the x and/or y axis. The different widths X can be determined by a function which is defined in sections and whose values are then stored in a two-dimensional vector.

For each width X, it is then also necessary to define a start value in the x direction (e.g. beginning of the width X or central point), on account of the asymmetry.

It should be noted that the blocks or columns separated by wiring channels 112 need not necessarily be of the same width, but rather can also have different widths.

FIG. 3A diagrammatically illustrates three columns 11, 12, 13 with two wiring channels 112, 123. In this case, the edges of the columns are each slightly rounded at both sides.

FIG. 3B illustrates the same situation, in principle, but here the columns 11, 12, 13 are straight at the right-hand and, respectively, left-hand outer sides.

Figure 4:
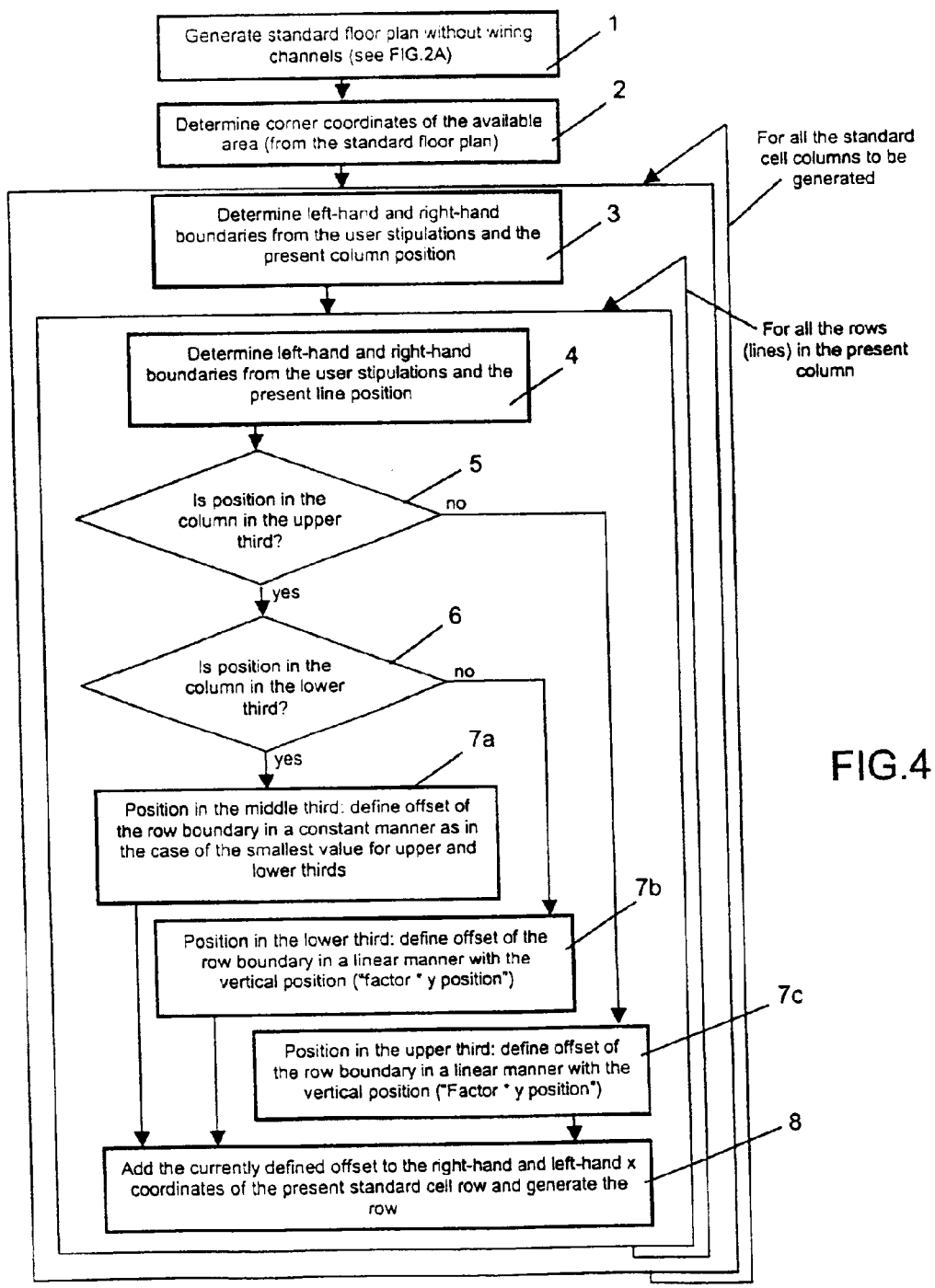
FIG. 4 is a program flowchart outlining the fabrication of a semiconductor chip according to the invention.

FIG. 4 illustrates a program flowchart for an embodiment of the method according to the invention. It should be noted that the method according to the invention which is described here represents only a part of the otherwise known fabrication method for semiconductor chips.

Figure 4A:
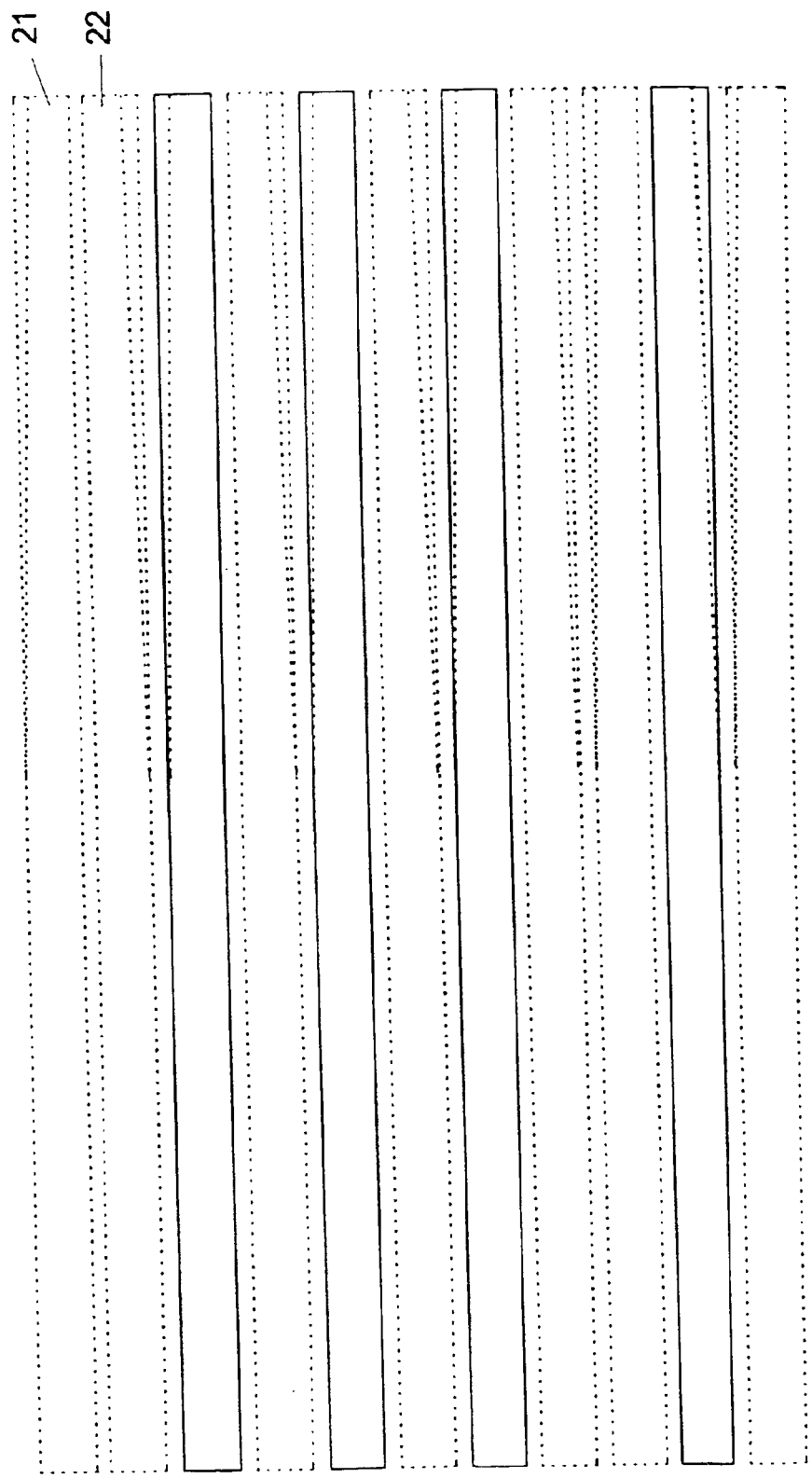
FIG. 4A is a diagrammatic illustration of rows of standard cells without wiring channels.

The starting point is the first method step 1, in which a standard floor plan is created with an arrangement of the standard cells without wiring channels 112, 123, 134, 112', 123', 134'. This is illustrated in FIG. 4A.

Afterward, in a second method step 2, the corner coordinates of the available area are determined automatically using the standard floor plan.

The third method step 3 represents the entry into a loop which is iterated for all the standard cell columns.

Within this outer loop, an inner loop is iterated for all the present rows (if appropriate columns, too).

In the fourth method step 4, the left-hand and right-hand boundaries of the wiring channel 112, 123, 134, 112', 123', 134' at this location are calculated from the user stipulations and the present vertical line position.

In the fifth method step 5, a check is made to determine whether the position of the row that is currently being examined is situated in the upper third of the column.

If this check turns out to be negative, in the sixth method step 6 a check is made to determine whether the position of the row that is currently being examined is situated in the lower third of the column.

If this check turns out to be negative, i.e. the row is located in the middle third, then, in the first variant of the seventh method step 7a, an offset for the row boundaries is defined, which offset corresponds in a constant manner to the smallest value of the upper and lower thirds. The assignment specification thus corresponds to a constant in the middle third. The width X of the wiring channel 112, 123, 134, 112', 123', 134' is defined by way of the offsets.

Afterward, in the eighth method step 8, the calculated offset is added to the right-hand and left-hand x coordinates of the respectively calculated standard cell row and the row is correspondingly formed. This is followed by a return for the determination of the width X in the next row.

In this case, a small offset means that, in the region of the middle third, the wiring channel 112, 123, 134, 112', 123', 134' is changed only little relative to a stipulation.

In the upper and lower thirds, by contrast, the offsets are changed by means of a linear function.

The second alternative of the seventh method step 7b relates to the case where the position is located in the lower third. The offset for the row boundary is then determined by a linear assignment specification Factor*(max Y−y position)

depending on the y coordinate.

The assignment specification in accordance with the third alternative of the seventh method step 7c for the upper third accordingly reads Factor*y position.

A wiring channel essentially having the contour of a polygon progression that is symmetrical with respect to the y axis is thus obtained.

By variation of the assignment specifications, it is also possible to generate other geometries adapted to the respective purpose.

Once the inner loop has been iterated, a return is made to the outer loop.

The termination criterion, not illustrated here, is a check to determine whether all the columns and rows have been encompassed by the algorithm.

The text below describes advantageous refinements in which the tracks for power supply are also concomitantly included in the configuration of the wiring channels.

Figure 5:
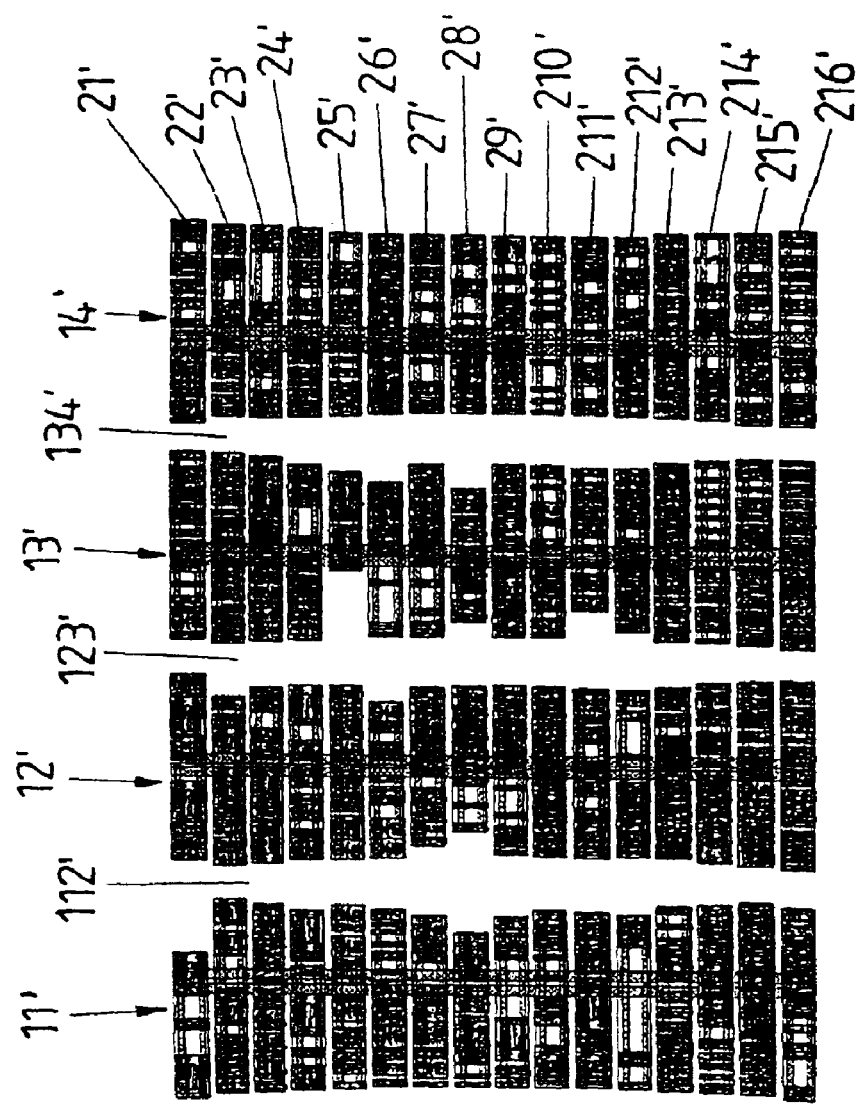
FIG. 5 is an illustration of a semiconductor chip with columns modified according to the invention.
Figure 5A:
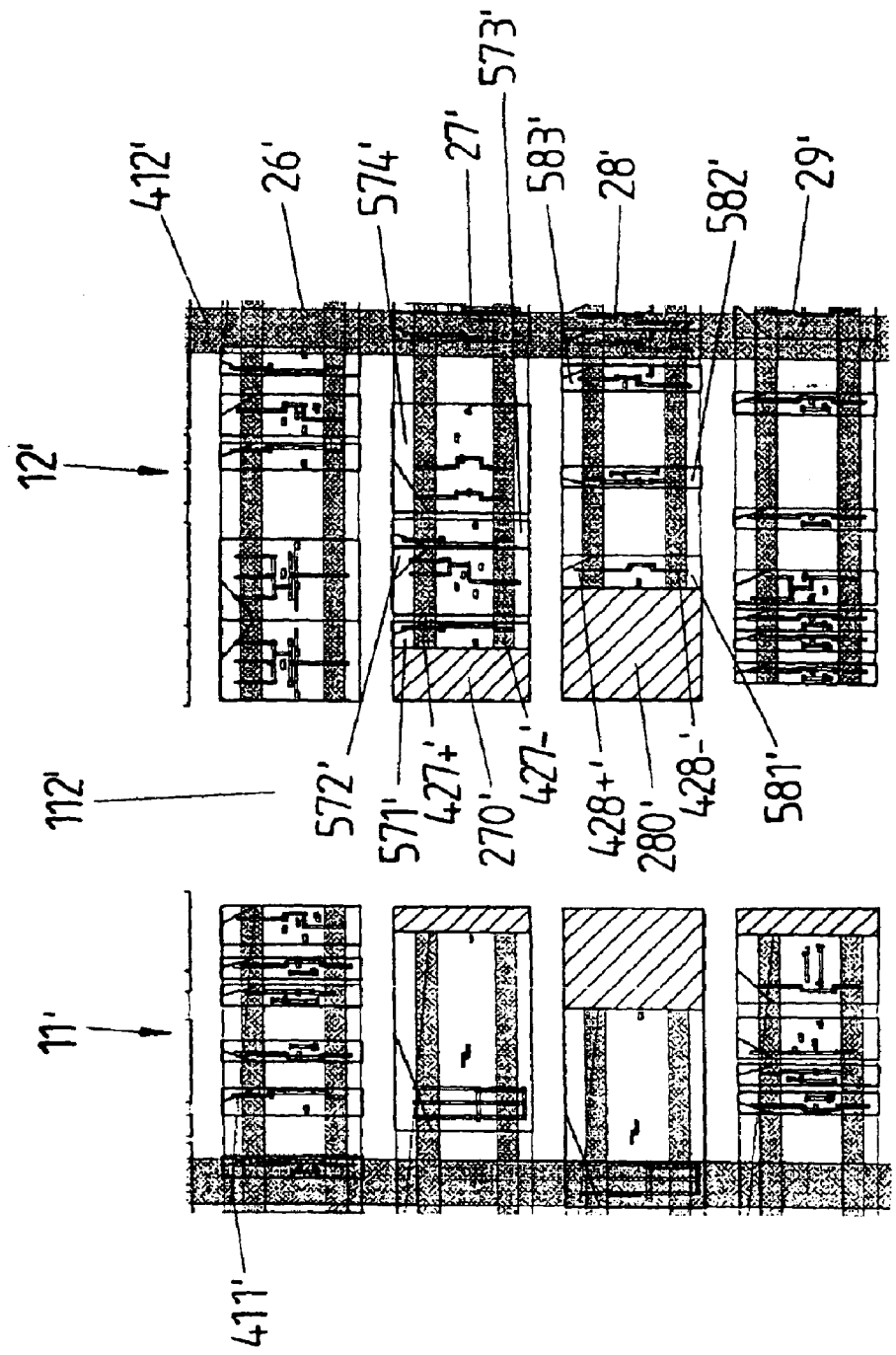
FIG. 5A is a partial detail illustration from FIG. 5.

An advantageous refinement of the invention is illustrated in FIGS. 5 and 5A. Here, the above-mentioned arrangement of the wiring channels 112', 123', 134' according to the invention is used and then the width of the rows 21' to 216' of the columns 11' to 14' is significantly reduced. By way of this reduction in the width of the rows 21' to 216', the wiring channels 112', 123', 134' are once more significantly widened, so that it is possible to increase a number of vertical connections within these wiring channels 112', 123', 134'.

For this purpose, the tracks for power supply 422+ and 422− are shortened in the region 220 which reaches beyond the outer standard cell 521, as is illustrated in FIG. 1a. Such a shortening is illustrated in FIG. 5A. The wiring channel 112' between the columns 11' and 12' is widened at least in lines by virtue of the regions 270', 280' of the rows 27' and 28' which project beyond the outer standard cell not having power supply tracks 427+', 427−', 428+' and 428−'. Consequently, these regions can additionally be utilized for a vertical or else horizontal wiring.

In addition, in an embodiment that is not illustrated, the regions 221, 222 between the standard cells 522, 523, etc. as illustrated in FIG. 1A are shortened by the standard cells 522, 523, etc. being arranged adjacent to one another. This is advantageous particularly when the standard cells 522, 523, etc. can be positioned flexibly in specific regions, so that the wiring (routing) is thereby influenced only to an insignificant extent.

Figure 6:
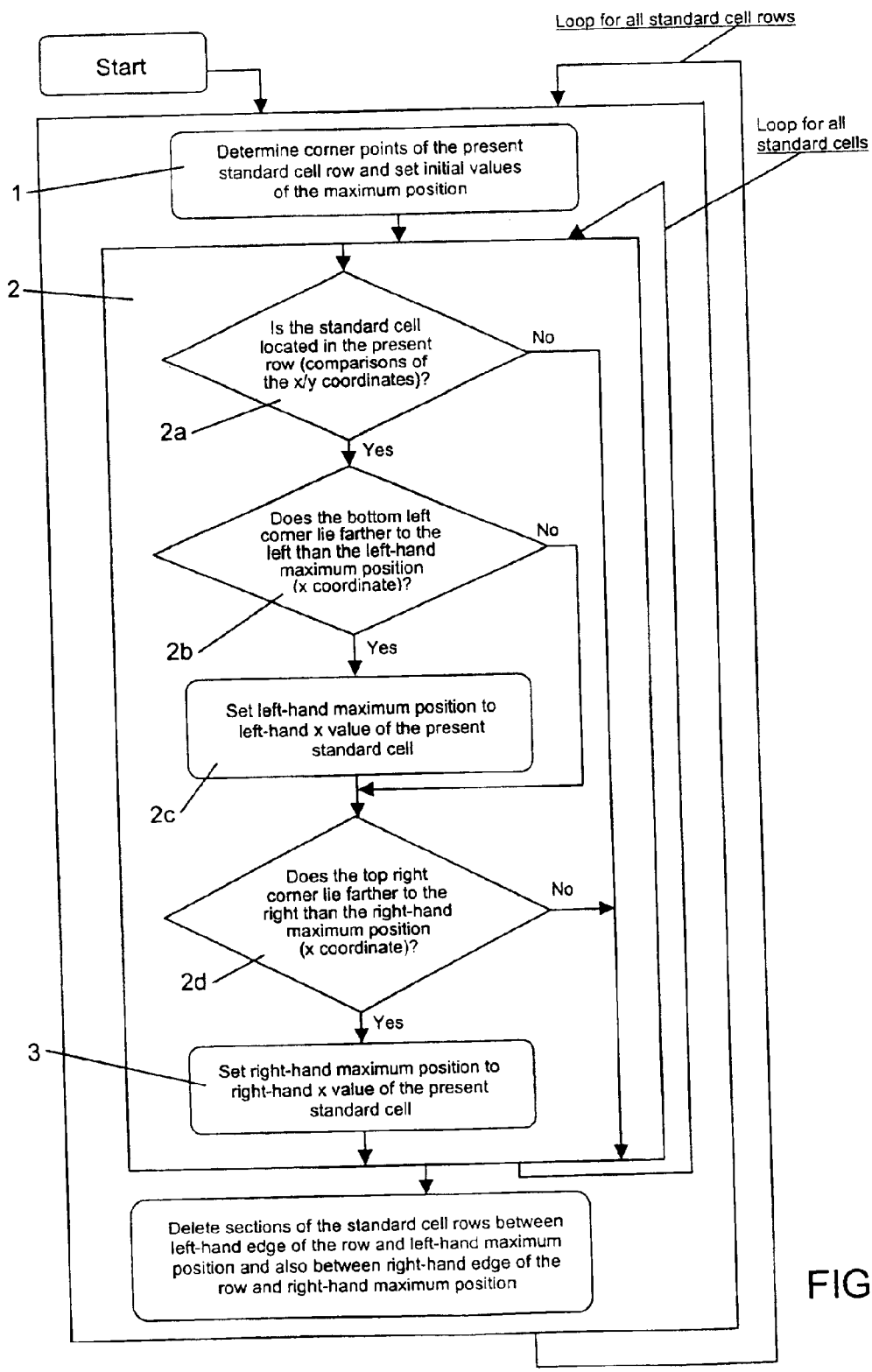
FIG. 6 is a diagrammatic flowchart illustration of part of a method sequence for the wiring of a semiconductor chip.

FIG. 6 shows a diagrammatic illustration of part of a method sequence for the wiring of a semiconductor chip. After the start of the sequence, the corner points of the present standard cell row are determined in step 1. In addition, for this row, the left-hand maximum position and the right-hand maximum position are set to the center of the standard cell row as initial value. In step 2, each standard cell SZ is compared with these corner points in order to determine whether this present standard cell SZ is situated within the present row and whether this present standard cell SZ is an outer standard cell SZ of the row.

In step 2a, for this purpose, a comparison of x coordinates and y coordinates is made in order to check whether the present standard cell SZ is situated in the present row. If this is not the case, a further standard cell SZ is compared with the corner points. For this purpose, the method sequence preferably has a loop for all the standard cells SZ to be compared.

If the present standard cell SZ is situated within the present row, a left-hand corner of the present standard cell SZ is subsequently compared, in step 2b, with the present maximum position of the row. If the bottom left corner lies further to the left than the left-hand maximum position, in step 2c the left-hand maximum position is set to the left-hand x value of the present standard cell SZ. In steps 2d and 2e, the steps which are analogous to steps 2b and 2c are effected for the right-hand maximum position. Afterward, in accordance with the loop, a further standard cell SZ is compared until at least all the coordinates of standard cells SZ which are relevant to this row have been evaluated.

Afterward, in step 3, the sections of the standard cell rows between the left-hand edge of the row and the left-hand maximum position, and also between the right-hand edge of the row and the right-hand maximum position, are deleted. This part of the method sequence of steps 1 to 3 is carried out for all the standard cell rows by means of a further loop.

In a departure from this exemplary embodiment, other iterative methods are also conceivable which calculate the shortening of the power supply tracks up to the first (outer) standard cell.

It will be understood that the implementation of the invention is not restricted to the preferred exemplary embodiments specified above. Rather, a number of variants are conceivable which also make use of the semiconductor chip according to the invention or the fabrication method in the case of embodiments of fundamentally different configuration, for example a new arrangement of standard cells.

We claim:

1. A semiconductor chip, comprising:
 a multiplicity of standard cells arranged in a plurality of mutually adjacent rows;
 tracks disposed to connect said standard cells to at least one of other elements of the semiconductor chip and terminals of the semiconductor chip, said tracks including power supply tracks for a power supply to said standard cells;
 signal track regions defined for arranging signal tracks between the rows;
 said signal track regions adjoining said power supply tracks for the power supply of said standard cells; and
 a respective said power supply track for supplying power to at least one row of said standard cells is a shortened track such that an adjoining said signal track region is enlarged due to a shortening of the respective said power supply track.

2. The semiconductor chip according to claim 1, wherein said signal track regions are formed as wiring channels, and a width of at least one wiring channel, at a given location along said wiring channel, is determined by a prescribed unambiguous and variable assignment specification.

3. The semiconductor chip according to claim 1, wherein said shortened tracks terminate in a region of a standard cell at an edge of the respective said row.

4. The semiconductor chip according to claim 3, wherein said power supply tracks terminate within said standard cells at an edge of the row.

5. The semiconductor chip according to claim 1, wherein said signal track regions adjoin ends of said power supply tracks, at least in one wiring plane of said power supply tracks, and wherein one or more signal tracks serving for transmitting signals between said standard cells or the terminals of the semiconductor chip are disposed in said adjoining signal track regions.

6. The semiconductor chip according to claim 1, wherein one or more signal tracks with a course at least partially perpendicular to the row of said standard cells are disposed in said signal track regions.

7. The semiconductor chip according to claim 1, wherein said standard cells within one row are positioned with respect to one or more corresponding standard cells of another row so as to shorten signal tracks for transmitting time-critical signals between said standard cells.

8. The semiconductor chip according to claim 1, wherein said standard cells are disposed adjacent one another within a row to reduce interspaces between said standard cells.

9. The semiconductor chip according to claim 2, wherein the unambiguous assignment specification is a specification selected from the group consisting of a functional relationship, a table with predetermined values, and a correlation.

10. The semiconductor chip according to claim 2, wherein the unambiguous assignment specification includes at least one element selected from the group consisting of a linear function, at least one polygon progression, and a polynomial.

11. The semiconductor chip according to claim 2, wherein said signal track regions comprise at least one wiring channel with a longitudinal axis, and at least one width determined by the unambiguous assignment specification is arranged symmetrically with respect to the longitudinal axis of said wiring channel.

12. The semiconductor chip according to claim 2, wherein the at least one wiring channel extends in a vertical direction, and the width of the at least one wiring channel is dependent on a vertical position of the location.

13. The semiconductor chip according to claim 2, wherein a distribution of respective widths of said at least one wiring channel defines a contour, and said contour is symmetric about a horizontal axis.

14. The semiconductor chip according to claim 2, wherein the width of said at least one wiring channel is determined by an assignment specification in dependence on a crossing density of wirings in said wiring channel.

15. The semiconductor chip according to claim 14, wherein said wiring channels have a maximum crossing density, and a maximum width is formed in a region of the maximum crossing density.

16. A semiconductor chip, comprising:
 standard cells disposed in a plurality of mutually adjacent rows;
 wiring channels formed between the rows; and
 a width of at least one of said wiring channels, in at least one location along said wiring channels, being defined by a predetermined unambiguous and variable assignment specification.

17. In a semiconductor chip manufacture, a device for carrying out the following method steps:
 evaluating a prescribed variable assignment specification for a width of at least one wiring channel at a location along the wiring channel; and
 subsequently laterally forming at least one structure selected from the group consisting of a standard cell and a row of the standard cells such that the at least one wiring channel has the width at the location in accordance with the assignment specification; and
 including a module for evaluating the prescribed variable assignment specification and a module for laterally arranging the at least one standard cell or the at least one row of standard cells.

18. A computing device for fabricating a semiconductor chip, comprising a processing device programmed to:
 evaluate a prescribed variable assignment specification for a width of at least one wiring channel at a location along the wiring channel; and
 subsequently laterally form at least one structure selected from the group consisting of a standard cell and a row of the standard cells such that the at least one wiring channel has the width at the location in accordance with the assignment specification.

19. A computer-readable medium having computer-executable instructions, comprising instructions for carrying out the following steps:
 evaluating a prescribed variable assignment specification for a width of at least one wiring channel at a location along the wiring channel; and
 subsequently laterally forming at least one structure selected from the group consisting of a standard cell and a row of the standard cells such that the at least one wiring channel has the width at the location in accordance with the assignment specification.

20. A computing device for fabricating a semiconductor chip, comprising a processing device programmed to:
 form standard cells within a plurality of mutually adjacent rows;
 connect each of the standard cells with a plurality of tracks for connection to other structures selected from the group consisting of another element of the semiconductor chip and a terminal of the semiconductor chip;

determine a power supply region of at least one outer standard cell of the standard cells of the respective row; and determine a configuration of tracks for power supply up to the power supply region of the standard cell.

21. A computer-readable medium having computer-executable instructions, comprising instructions for carrying out the following steps:

forming standard cells within a plurality of mutually adjacent rows;

connecting each of the standard cells with a plurality of tracks for connection to other structures selected from the group consisting of another element of the semiconductor chip and a terminal of the semiconductor chip;

determining a power supply region of at least one outer standard cell of the standard cells of the respective row; and determining a configuration of tracks for power supply up to the power supply region of the standard cell.

22. In a semiconductor chip manufacture, a device for carrying out the following method:

forming standard cells within a plurality of mutually adjacent rows;

connecting each of the standard cells with a plurality of tracks for connection to other structures selected from the group consisting of another element of the semiconductor chip and a terminal of the semiconductor chip;

determining a power supply region of at least one outer standard cell of the standard cells of the respective row; and determining a configuration of tracks for power supply up to the power supply region of the standard cell;

and including a module for determining a power supply region of at least one of the outer standard cells of the respective row, and for arranging power supply tracks up to the power supply region of the outer standard cell.

* * * * *